United States Patent
Angot et al.

(10) Patent No.: US 10,580,863 B2
(45) Date of Patent: Mar. 3, 2020

(54) TRANSISTOR ELEMENT WITH REDUCED LATERAL ELECTRICAL FIELD

(71) Applicant: GLOBALFOUNDRIES Inc., Grand Cayman (KY)

(72) Inventors: Damien Angot, Dresden (DE); Alban Zaka, Dresden (DE); Tom Herrmann, Dresden (DE); Venkata Naga Ranjith Kuma Nelluri, Dresden (DE); Jan Hoentschel, Dresden (DE); Lars Mueller-Meskamp, Dresden (DE); Martin Gerhardt, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/728,679

(22) Filed: Oct. 10, 2017

(65) Prior Publication Data
US 2019/0109192 A1 Apr. 11, 2019

(51) Int. Cl.
| | |
|---|---|
| H01L 27/088 | (2006.01) |
| H01L 21/336 | (2006.01) |
| H01L 27/12 | (2006.01) |
| H01L 31/0392 | (2006.01) |
| H01L 29/10 | (2006.01) |
| H01L 21/84 | (2006.01) |
| H01L 29/66 | (2006.01) |
| H01L 21/225 | (2006.01) |
| H01L 29/786 | (2006.01) |
| H01L 29/06 | (2006.01) |
| H01L 29/417 | (2006.01) |
| H01L 29/78 | (2006.01) |

(52) U.S. Cl.
CPC ...... *H01L 29/1041* (2013.01); *H01L 21/2254* (2013.01); *H01L 21/84* (2013.01); *H01L 29/0649* (2013.01); *H01L 29/41783* (2013.01); *H01L 29/66575* (2013.01); *H01L 29/66628* (2013.01); *H01L 29/78* (2013.01); *H01L 29/78621* (2013.01)

(58) Field of Classification Search
CPC ... H01L 27/1203; H01L 29/518; H01L 29/78; H01L 27/0922; H01L 27/105; H01L 27/10894; H01L 21/823412; H01L 21/823418; H01L 21/823807; H01L 29/7833
See application file for complete search history.

(56) References Cited

U.S. PATENT DOCUMENTS

| | | | | |
|---|---|---|---|---|
| 5,989,967 A | * | 11/1999 | Gardner | H01L 21/28123 257/344 |
| 2002/0105033 A1 | * | 8/2002 | Zhang | H01L 27/1214 257/353 |
| 2003/0209737 A1 | * | 11/2003 | Mitani | H01L 29/66757 257/241 |

(Continued)

*Primary Examiner* — Brian Turner
(74) *Attorney, Agent, or Firm* — Amerson Law Firm, PLLC

(57) ABSTRACT

In sophisticated semiconductor devices, the lateral electric field in fully depleted transistor elements operated at elevated supply voltages may be significantly reduced by establishing a laterally graded dopant profile at edge regions of the respective channel regions. In some illustrative embodiments to this end, one or more dopant species may be incorporated prior to completing the gate electrode structure.

2 Claims, 7 Drawing Sheets

(56) References Cited

U.S. PATENT DOCUMENTS

| | | | |
|---|---|---|---|
| 2004/0004252 A1* | 1/2004 | Madurawe | H01L 21/8221 257/347 |
| 2004/0053454 A1* | 3/2004 | Chen | H01L 29/66757 438/163 |
| 2005/0082573 A1* | 4/2005 | Williford | H01L 21/26586 257/202 |
| 2006/0008973 A1* | 1/2006 | Phua | H01L 21/26586 438/231 |
| 2006/0145253 A1* | 7/2006 | Lee | H01L 29/6653 257/344 |
| 2008/0121889 A1* | 5/2008 | Ishiguro | H01L 29/42384 257/66 |
| 2008/0286952 A1* | 11/2008 | Miyairi | H01L 21/76254 438/517 |
| 2012/0228711 A1* | 9/2012 | Hoshino | H01L 27/1203 257/368 |
| 2012/0267706 A1* | 10/2012 | Luo | H01L 29/66545 257/329 |
| 2013/0280883 A1* | 10/2013 | Faul | H01L 21/2255 438/434 |
| 2014/0131735 A1* | 5/2014 | Hoentschel | H01L 21/84 257/77 |
| 2015/0206942 A1* | 7/2015 | Glass | H01L 29/66795 257/335 |

\* cited by examiner

TRANSISTOR ELEMENT WITH REDUCED LATERAL ELECTRICAL FIELD

BACKGROUND

1. Field of the Disclosure

Generally, the present disclosure relates to semiconductor devices and manufacturing techniques in which transistor elements may be formed on the basis of a very thin crystalline semiconductor material.

2. Description of the Related Art

Significant progress has been made in the field of semiconductor devices, mainly driven by a steady reduction of the critical dimensions of circuit elements in such semiconductor devices. In sophisticated semiconductor devices, a major part of the circuit elements provided therein are typically based on CMOS technology, which, in turn, is based on respective field effect transistors having a channel region whose conductivity is controlled by an appropriate control voltage. The control voltage is typically applied by using an appropriate electrode structure, typically referred to as a gate electrode structure, which includes an electrode material that is separated from the semiconductor material of the channel region by a dielectric material. Consequently, upon operating such a field effect transistor, the current flow in the channel region from the source region to the drain region may be efficiently controlled by applying the control voltage to the gate electrode structure, wherein transistor characteristics, such as threshold voltage, current drive capability and the like, may depend on various device parameters.

Generally, the continuous reduction of critical dimensions of field effect transistors, in particular, the length of the channel region, may contribute to increased overall packing density, while a certain degree of performance gain may also accompany a size reduction of the transistors. On the other hand, the ongoing reduction of critical dimensions of field effect transistors is also associated with significant problems that have to be addressed in order to not unduly offset the performance advantages that would be generally achieved by reducing the critical feature sizes. For example, effective controllability of the channel region of the transistor elements strongly depends on the capacitive coupling of the gate electrode structure to the channel region and becomes typically more complex upon reducing the channel length of the transistors. Therefore, a thickness of the gate dielectric material must be appropriately adapted so as to provide sufficient capacitive coupling, while still ensuring appropriate dielectric strength with respect to the supply voltage and/or control voltage applied upon operating the transistor element, if these voltages are different from each other. Therefore, in complex semiconductor devices, different types of gate electrode structures, including different types and/or materials with different thicknesses, may be typically used so as to comply with the overall device requirements, since, typically, transistor elements in a complex integrated circuit may be designed for different purposes. For example, in certain logic paths of a more or less complex controller circuit, increased switching speed of the respective field effect transistor may be of high priority, thereby requiring extremely reduced gate length dimensions in combination with respectively adapted gate electrode structures. In order to not unduly increase overall power losses, for instance, by static and dynamic leakage currents, attempts have been made to design the respective transistors so as to enable operation at moderately low supply voltages, such as approximately 1 V or even less in sophisticated currently available semiconductor devices.

In other device areas, an increased operating voltage may be generally required, for instance, for providing appropriate matching to signal processing based on external signals and/or signals provided by different device portions, which may generally operate on the basis of an increased supply voltage. For example, input/output portions of a complex integrated circuit may frequently operate at elevated supply voltages compared to an "internal" reduced supply voltage for sophisticated digital circuit areas, wherein 2.5 to 3.3 V are frequently used operating voltages. Consequently, due to these significant increased supply voltages and, thus, gate voltages, a corresponding adaptation of certain transistor parameters, such as thickness of the gate dielectric material and the like, may have to be taken into consideration.

Upon the further reduction of critical dimensions aimed at enhancing overall performance and, in particular, for providing superior packing density of such integrated circuits, different approaches have been developed, for instance, in terms of enhancing overall channel controllability. One promising approach involves the provision of substantially fully depleted channel regions with reduced dopant concentration. To this end, a very thin basic semiconductor material, such as crystalline silicon material, crystalline silicon/germanium material and the like, may be provided with very low dopant concentration or even as an intrinsic material, thereby contributing to the reduction of scattering events and any scattering centers, which are typically associated with the incorporation of a dopant species. Furthermore, a substantially full depletion of the channel region may be achieved for a certain transistor state when a substantially non-conductive channel is required. In such sophisticated planar transistor configurations, the very thin basic semiconductor material, which may have an initial thickness of 15 nm and significantly less, may be combined with an appropriately designed gate electrode structure, thereby obtaining transistor elements having a channel length of approximately 30 nm and less. Furthermore, since the very reduced thickness of the semiconductor material may impart certain constraints with respect to providing highly conductive drain and source regions, such regions may be typically formed on the basis of a raised drain and source architecture in which an appropriately highly in situ doped semiconductor material may be grown on top of the initial semiconductor material.

Although this basic device configuration of transistors in sophisticated semiconductor devices may be highly effective for transistor elements designed for critical signal paths, it turns out, however, that, upon the further reduction of overall dimensions, significant reliability issues may arise for transistor elements having the same basic configuration in which an increased supply voltage has to be applied in order to comply with overall functional constraints of certain circuit portions, such as I/O (input/output) portions and the like. It has been recognized that corresponding reliability issues, i.e., degradation of device performance and/or premature failure of semiconductor devices, may be associated with hot carrier injection (HCI), which is a phenomenon occurring at increased supply voltages, wherein charge carriers injected at the source region may gain sufficient energy so as to overcome the potential of the gate dielectric material. That is, typically at the drain side, a certain amount of charge carriers may enter into and possibly penetrate through the gate dielectric material, thereby increasingly changing overall transistor characteristics, such as threshold voltage, leakage current behavior and the like.

In view of the situation described above, the present disclosure relates to techniques and semiconductor devices in which transistor elements may be formed on the basis of a thin basic semiconductor layer, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the finding that device degradation caused by high-energetic charge carriers may be reduced to a certain degree by implementing a graded dopant profile, at least at a relevant edge of the gate electrode structure, while still preserving the basic transistor configuration. To this end, in some illustrative embodiments disclosed herein, one or more types of dopant species of a required conductivity type may be implemented into the basic semiconductor material at any appropriate manufacturing stage prior to actually forming the gate electrode structure, thereby achieving a high degree of flexibility in appropriately providing the lateral gradation of the dopant profile. For example, appropriately designed implantation processes may be applied so as to not unduly affect the crystalline structure of the basic semiconductor material, yet, nevertheless, incorporating a lateral differing amount of dopant species in order to reduce the respective lateral electric field encountered during operation of the channel region with a desired relatively high operating voltage applied between the source region and the drain region of the respective transistor element.

In other illustrative embodiments disclosed herein, the lateral gradation of the dopant profile may be accomplished at a later manufacturing stage, for instance, based on a part of the gate electrode structure and/or a masking regime used for patterning the gate electrode structure, thereby contributing to superior process conditions, for instance, when a substantially self-aligned positioning of the laterally graded dopant profile may be considered as advantageous.

In other illustrative embodiments disclosed herein, establishing the laterally varying dopant profile may be accomplished on the basis of diffusion processes that may be controlled so as to establish specific diffusion conditions for two or more different dopant species and/or for incorporating one or more dopant species into the basic semiconductor material and, thus, to the vicinity of the gate edge regions.

One illustrative method disclosed herein includes forming a laterally graded dopant profile in at least one of a first edge region and a second edge region of a channel region that is provided in a crystalline semiconductor layer for a fully depleted transistor element. The method further includes forming a gate electrode structure on the channel region so as to overlap the first and second edge regions.

According to a further illustrative embodiment disclosed herein, a method is provided including forming a laterally graded dopant profile in at least one of a first edge region and an oppositely positioned second edge region of a channel region of a transistor element. Furthermore, the method includes, after forming the laterally graded dopant profile, forming a gate electrode structure on the channel region, wherein the channel region at least partially overlaps the first and second edge regions.

A further illustrative embodiment disclosed herein relates to a transistor element in a semiconductor device. The transistor element includes a channel region formed in a semiconductor layer having a thickness of approximately 15 nm or less, wherein the channel region has a first edge region extending along a transistor width direction and a second edge region extending along the transistor width direction. At least one of the first and second edge regions has a laterally graded dopant profile that decreases towards the center of the channel region. Furthermore, the transistor element includes a gate electrode structure formed on the channel region and the first and second edge regions. Additionally, the transistor element includes raised drain and source regions formed laterally adjacent to the gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
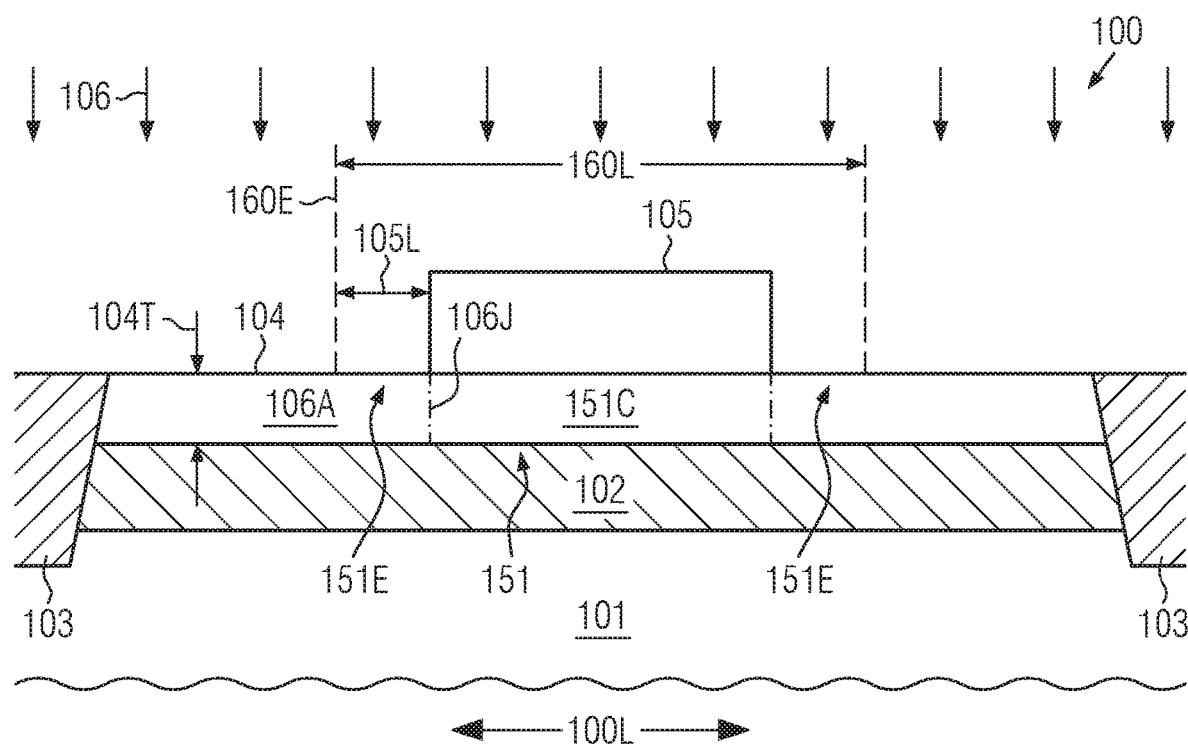
FIGS. 1A-1C schematically illustrate cross-sectional views of a semiconductor device in an early manufacturing phase in which dopant species may be incorporated into a thin semiconductor layer on the basis of an appropriate masking regime so as to obtain a laterally graded dopant profile prior to forming a gate electrode structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As discussed above, the high lateral electric field of charge carriers, in particular, at the drain side of a transistor element, may represent a reliability issue for transistors that may have to be operated on the basis of elevated supply voltages, such as approximately 2 V and higher, when sophisticated fully depleted device architectures may have to be implemented in order to comply with overall device requirements. Generally, the provision of a fully depleted transistor architecture, in particular, on the basis of an SOI (silicon- or semiconductor-on-insulator) configuration, may basically provide superior device performance, while, at the same time, reduce the effects of specific degradation mechanisms that are typically associated with the reduction of feature sizes of transistor elements to 30 nm and significantly less. For example, this type of basic transistor configuration still enables the application of well-established planar transistor architectures, while still providing the possibility of further reducing overall dimensions.

On the other hand, providing a very thin crystalline semiconductor layer, in particular formed on a buried insulating layer, may require the raised drain and source architecture for providing appropriate low-ohmic contact areas, thereby substantially preventing significant lateral dopant diffusion in the very thin basic semiconductor layer and therefore mitigating the development of a respective lateral graded dopant profile. Furthermore, the thin basic semiconductor material may not allow usage of high doses during an implantation process or process sequence, since amorphization of the basic semiconductor material may be encountered at significantly lower concentrations compared to semiconductor materials having a thickness of several 10 nm, as may be typically encountered in bulk architectures. For these reasons, the present disclosure provides techniques for establishing a laterally graded dopant profile, at least at one edge region of a channel region of a transistor element, on the basis of technical concepts in which the basis transistor configuration and, in particular, the thin semiconductor base material, may be preserved above the buried insulating layer. Thereby, the graded nature of the profile may still provide a significantly reduced lateral electrical field, in particular, at the drain side of the transistor element, thereby significantly improving the transistor behavior with respect to long term reliability, since injection of highly energetic charge carriers into and through the gate dielectric material may be significantly reduced.

According to some illustrative embodiments disclosed herein, incorporation of one or more dopant species of appropriate conductivity type may be accomplished in an early manufacturing phase, so that respective process parameters for incorporating the one or more dopant species may be specifically designed so as to comply with the requirements of a very thin crystalline semiconductor material without having to take into consideration the presence of raised drain and source regions. In some illustrative embodiments of these approaches, the dopant species may be incorporated prior to actually forming the gate electrode structure or a portion thereof, thereby achieving a high degree of flexibility in selecting an appropriate process for incorporating the dopant species and/or of respective masking regimes, if required for obtaining a lateral gradation of the dopant profile.

For example, in some illustrative embodiments, prior to forming any materials of the gate electrode structure, masked implantation processes may be applied in order to incorporate a varying lateral concentration of dopant species. In this way, in particular, the gradation of the dopant profile may be accomplished on the drain side of the channel region for transistor elements for which source and drain may not change in function when a respective region is to always be used as a drain region or a source region. In other cases, when a symmetric lateral dopant profile may be desired at edge regions, i.e., regions extending along a transistor width direction and having their dopant profile varying along the transistor length direction, incorporation of the laterally varying dopant profile may be accomplished on the basis of masked implantation processes, for which one or more process parameters may be varied. For example, the degree of masking, i.e., at least the size of the respective implantation mask along the transistor length direction, may be varied for two or more implantation processes, so that edge regions may experience different amounts of dose, even for otherwise identical process parameters, such as implantation energy, implantation species and the like. Furthermore, during the entire masked implantation sequence, the process parameters, in particular implantation energy and dose, may be adapted so as to maintain the degree of implantation-induced lattice damage at a level that still enables efficient recrystallization during a subsequent anneal process, even if any template material in lower lying device areas may not be present due to the presence of the buried insulating layer when an SOI configuration is considered.

In other illustrative embodiments, in addition to or alternative to varying the degree of masking, other process parameters may be varied, such as the type of dopant species, which may have different diffusion coefficients, thereby achieving a different degree of diffusion during a subsequent anneal process. This may also be advantageously used in obtaining a laterally varying dopant profile, even for otherwise identical process parameters. That is, even if a single mask may be used for incorporating at least two different types of dopant species of the same conductivity type into non-masked portions of the basic semiconductor layer, the different diffusion behavior may finally result in a laterally graded profile, thereby also contributing to a reduction of the lateral field variation during operation of the respective transistor element. In other cases, a varying degree of masking during respective implantation processes may be combined with the incorporation of different types of dopant species, at least in some stages of the overall process sequence, thereby providing an additional control mechanism for appropriately adjusting a desired lateral dopant profile.

In still other cases, in addition to or alternative to the above-referenced control mechanisms, a lateral dopant profile may be obtained on the basis of varying implantation parameters, such as implantation dose and/or implantation energy and/or implantation angle, which may, nevertheless, be generally adapted to the specific configuration of the basis semiconductor material.

In still other illustrative embodiments disclosed herein, the above-described processes for incorporating one or more dopant species may be applied in a further advanced manufacturing stage, for instance, after forming at least a portion of the gate electrode structure and/or a portion of a respective patterning mask used for patterning the gate electrode structure. In this case, at least for one implantation process, a substantially self-aligned behavior for incorporating the dopant species may be achieved, substantially without unduly affecting the overall gate patterning process.

In still other illustrative embodiments disclosed herein, incorporation of one or more dopant species may be at least partially accomplished on the basis of an appropriately positioned diffusion layer, such as a diffusion layer formed in or in the vicinity of respective isolation trenches, so as to achieve a desired lateral diffusion of the dopant species to the corresponding edge regions of a channel region still to be formed.

FIG. 1A schematically illustrates a cross-sectional view of a semiconductor device 100 in an early manufacturing stage, i.e., in a manufacturing stage at which a gate electrode structure of a transistor element is still to be formed. In the manufacturing stage shown, the semiconductor device 100 may comprise a substrate 101, such as a crystalline silicon material or any other carrier material depending on the required overall device configuration. It should be appreciated that a crystalline semiconductor material may be frequently used as the substrate material 101 in order to form therein doped regions, circuit elements and the like as may be required in the device 100, in combination with sophisticated transistor elements, which may be formed on the basis of a crystalline material 104, such as a silicon material, a silicon/germanium material and the like. In the configuration shown in FIG. 1A, an SOI architecture may be used in which the semiconductor layer 104 may be formed on a buried insulating layer 102, which may comprise silicon dioxide, silicon nitride and/or other dielectric materials, such as high-k dielectric materials and the like. It should be appreciated that the thickness and configuration of the buried insulating layer 102 may be at least locally adapted to specific device constraints, if required. Moreover, as previously discussed, in some illustrative embodiments, a thickness 104T of the semiconductor layer 104 may be in the range of 15 nm and less, wherein a final thickness and/or material composition may be adjusted at any appropriate manufacturing stage, for instance, by removing a portion of an initially supplied semiconductor material, by forming epitaxially grown layer portions and the like. For example, frequently, a silicon/germanium material may be locally formed in certain device areas in order to comply with the respective device requirements.

Furthermore, in this manufacturing stage, the semiconductor layer 104 and the buried insulating layer 102 may be laterally bordered by an appropriate isolation structure 103, such as a trench isolation, which may be formed of silicon dioxide, silicon nitride or any other appropriate dielectric material.

It should be appreciated that the "lateral" direction herein is to be understood as a direction corresponding to a transistor gate length (current transport) direction, as indicated by 100L, while a direction perpendicular to the transistor length direction 100L may be considered as a transistor gate width direction (not shown) corresponding to a direction perpendicular to the drawing plane of FIG. 1A.

Consequently, the isolation structure 103 may extend along the transistor width direction so as to define a transistor length along this direction, i.e., a dimension of the semiconductor layer 104 along the transistor length direction 100L, which may also be denoted as an active layer or active region of a transistor element still to be formed in and on the semiconductor layer 104. It should be appreciated that, in some illustrative embodiments, the isolation structure 103 may provide a bordering of the semiconductor layer 104 in one lateral direction only, that is, the isolation structure 103 may stand along the width direction, i.e., the direction perpendicular to the drawing plane of FIG. 1A, whereas a respective isolation extending along the length direction 100L so as to restrict a width of the semiconductor layer 104, may not have been yet provided or may be merely provided in the form of a trench "cutting" through the semiconductor layer 104 without being filled with dielectric material.

Furthermore, in this manufacturing stage, an implantation mask 105 may be provided above the semiconductor layer 104 in an area which may correspond to an area that may be covered by a gate electrode structure in a later manufacturing stage. The implantation mask 105 may be provided in the form of any appropriate material, such as a polymer material, a dielectric material in the form of silicon dioxide and the like, or any other material that may have appropriate characteristics for being patterned on the basis of a lithography process and may act as an efficient mask material during an implantation process 106. The implantation mask 105 may be positioned so as to define at least one border of an edge region 151E of a channel region 151, which may represent a region of the semiconductor layer 104, which may be subsequently covered by a gate electrode structure still to be formed, so as to establish a conductive channel therein upon operating a transistor element still to be formed. A respective gate electrode structure may, thus, have edges 160E, which may, therefore, define a respective gate length 160L. Consequently, by appropriately positioning the implantation mask 105 and defining a respective lateral size thereof, a corresponding distance 105L of the implantation mask 105 from the edge 160E may be defined, thereby exposing the respective edge region 151E during the implantation process 106, while reliably avoiding incorporation of dopant species in the central area 151C of the channel region 151.

The semiconductor device 100 as shown in FIG. 1A may be formed on the basis of the following processes. Typically, the substrate material 101 may be provided in the form of an upper portion of an appropriate carrier substrate, such as a silicon substrate and the like, wherein the buried insulating layer 102 may be typically formed, at least locally, on the substrate material 101 by well-established process techniques, such as oxidation, deposition and the like. Moreover, the semiconductor layer 104 in its initial composition and thickness, i.e., the thickness 104T, may be provided by any appropriate technique, for instance, by wafer bonding, in order to transfer the layer 104 from a donor substrate to the buried insulating layer 102 and the like. Thereafter, prior to or after the isolation structure 103 is formed, doped regions (not shown) may be formed in the substrate material 101 with a configuration as required by overall design criteria. The isolation structure 103 may be formed by well-established process techniques in which the semiconductor layer 104 may be masked by any appropriate material or material system followed by sophisticated lithography and etch techniques in order to form trenches extending along the width direction, i.e., the direction perpendicular to the drawing plane of FIG. 1A, and having a desired extension along the length direction 100L. Thereafter, the trenches may be filled with any appropriate dielectric material and excess material may be removed by well-established planarization techniques.

Next, the mask 105 may be formed by any well-established lithography techniques, wherein the patterning of the implantation mask 105 may be accomplished in one lateral dimension only, if required, so that the mask may extend along the width direction over a significant portion of the device 100, while the lateral size thereof may be defined during the lithography process in combination with a respective patterning process, such as a developing process, a trim-etch process and the like. It should be appreciated that, in some illustrative embodiments, the intended gate length 160L may not substantially correspond to a critical dimension of highly sophisticated transistor elements. Thus, the implantation mask 105 may be provided with a lateral size that is less than the gate length 160L and well within the capabilities of the corresponding lithography and patterning technology. In other cases, the implantation mask 105 may be initially provided with a lateral size, i.e., a dimension along the length direction 100L, that corresponds substantially to the gate length 160L, thereby applying and using similar patterning strategies, which may also be used upon forming sophisticated gate electrode structures. The finally desired reduced length of the implantation mask 105 may then be obtained on the basis of etch processes using well-established etch chemistries, thereby finally obtaining the distance 105L.

It should be appreciated that adjusting the distance 105L may also be referred to as adjusting the degree of masking of implantation mask 105 with respect to the implantation process 106.

Next, the implantation process 106 may be performed on the basis of appropriately selected process parameters so as to incorporate a specific dopant species into non-masked areas of the semiconductor layer 104, including the edge region 151E. As previously discussed, since a laterally graded dopant profile is to be established in the edge region 151E with the dopant concentration decreasing towards the center area 151C, the implantation process 106 may be performed on the basis of a corresponding low dose and an appropriately selected implantation energy so as to obtain a desired relatively low concentration of a specific dopant species. For example, when forming the graded dopant profile for an N-type transistor still to be formed, an N-type dopant species, such as arsenic, phosphorus and the like, may be incorporated during the process 106. Due to the moderately low dose, a corresponding degree of lattice damage may be relatively low, thereby allowing sufficient recrystallization in a later stage.

It should be appreciated that appropriate process parameters for the implantation process 106, in terms of implantation energy, implantation dose and selection of an appropriate dopant species, may be readily established on the basis of simulation calculations and/or experiments. To this end, the effect of a certain concentration of a dopant species with respect to the electrical field established in the edge region 151E upon using a specific supply voltage for a given transistor architecture may be readily determined by simulation and, hence, respective process parameters may be selected. In other cases, various test implantations may be performed with varying parameters and the results may be monitored for a plurality of test regions, including the layer 104 and the implantation mask 105. Appropriate parameters may then be selected upon evaluating the corresponding test results.

It should be appreciated that, in FIG. 1A and the subsequent drawings, the edge region 151E is typically illustrated so as to be present at both edges 160E of a gate electrode structure still to be formed. In this manner, a corresponding laterally graded dopant profile may be obtained at each of the edge regions 151E, irrespective of whether a corresponding region is adjacent to a drain region or a source region of a transistor element still to be formed. Consequently, in such a configuration, the function of the drain and source may change, depending on the corresponding electric status of the respective transistor element. In other illustrative embodiments (not shown), the implantation mask 105 may expose only one of the edge regions 151E, which is positioned adjacent to a respective drain region, which may be sufficient for reducing the lateral electrical field in the vicinity of the drain region when the function of the drain region and the source region may not change during the entire usage of the respective transistor element.

Consequently, after completing the implantation process 106, a respective low concentration of a dopant species 106A may be incorporated in exposed areas of the semiconductor layer 104, thereby forming a junction 106J, the lateral position of which is substantially defined by the implantation mask 105. It should be appreciated that the junction 106J may not actually represent a sharp boundary, but may vary to a certain degree due to the nature of the implantation process 106. Furthermore, the junction 106J may basically be shifted in a later manufacturing stage when a corresponding anneal process may be applied.

Figure 1B:
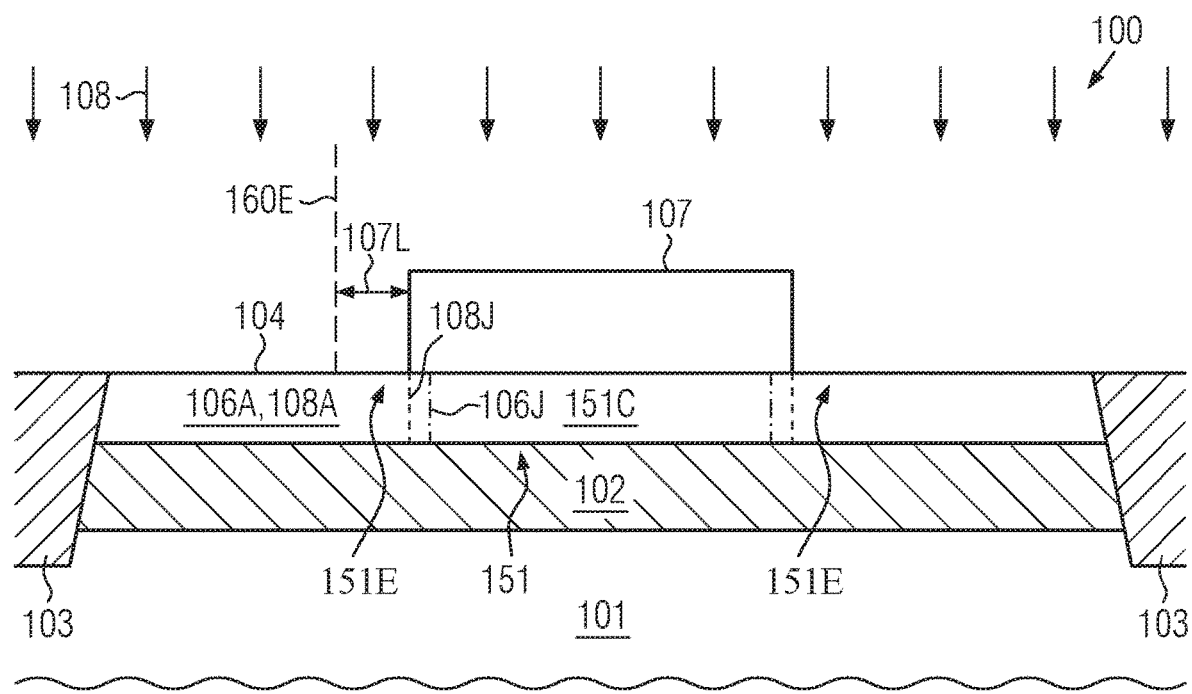

FIG. 1B schematically illustrates the semiconductor device 100 in a further advanced manufacturing stage. As illustrated, a further implantation mask 107 may be formed within the boundaries defined by the edges 160E of a gate electrode structure still to be formed. Consequently, a side surface of the implantation mask 107 may have a distance 107L with respect to the corresponding edge 160E, wherein the distance 107L may be less compared to the distance 105L of the implantation mask 105 (see FIG. 1A). Consequently, by exposing the device 100 to an implantation process 108, which may be performed on the basis of appropriately selected process parameters, a respective dopant species 108A may be incorporated into exposed portions of the semiconductor layer 104, thereby forming a second junction 108J that is laterally offset from the junction 106J, the lateral position of which may be defined by the implantation mask 107.

The implantation mask 107 may be formed on the basis of any well-established lithography and patterning strategies, as already discussed above, so as to obtain the lateral distance 107L after the previous implantation mask 105 (FIG. 1A) has been removed on the basis of well-established cleaning processes.

With respect to any implantation parameters for the process 108, the same previously discussed criteria may apply. That is, in some illustrative embodiments, appropriate implantation energy and dose for the dopant species 108A may be selected, for instance, on the basis of simulation calculations and/or experiments, wherein the process parameters are typically selected so that the cumulative effect of the implantation processes 106 (FIG. 1A) and 108 may result in a desired dopant concentration in non-exposed portions of the semiconductor layer 104, thereby forming the junction 108J, which is to be understood as the region in which the concentration more or less abruptly changes to a reduced concentration represented by the junction 106J. Consequently, in total, a moderately increased dose and, thus, concentration, may be obtained compared to the previously performed implantation process. Thereafter, the implantation mask 107 may be removed by any appropriate cleaning process based on plasma and/or wet chemistry.

Figure 1C:
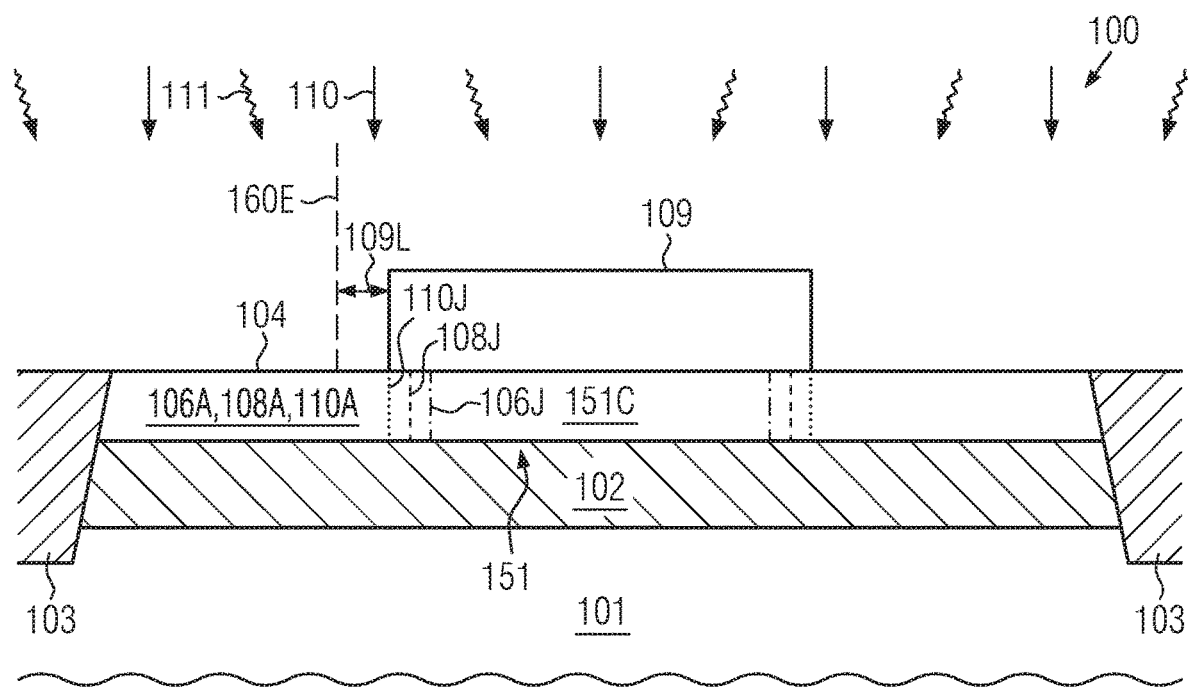

FIG. 1C schematically illustrates the semiconductor device 100 in a further advanced manufacturing stage. As illustrated, after removal of the implantation mask 107 (FIG. 1B), a further implantation mask 109 may be provided so as to define a further lateral distance 109L with respect to the edge 160E, wherein the lateral distance 109L may be less than the lateral distance 107L of the implantation mask 107 of FIG. 1B. Moreover, a further implantation process 110 may be applied so as to introduce a dopant species 110A into exposed portions of the semiconductor layer 104, thereby forming a further junction 110J defined by the sidewalls of the implantation mask 109. With respect to parameters of the implantation process 110 and techniques for forming the implantation mask 109, the same criteria may apply as previously discussed. That is, process parameters such as energy and dose, as well as selection of an appropriate species, may be obtained on the basis of simulation calculations and/or experiments, while the implantation mask 109 may be formed in accordance with appropriate patterning strategies and lithography techniques so as to obtain the desired degree of masking during the implantation process 110. Consequently, the respective junctions 110J, 108J, 106J represent a gradation of dopant concentration that decreases towards the central area 151C, thereby also resulting in a desired reduction of the lateral electric fields during operation of a gate electrode structure still to be formed. On the other hand, the dopant concentration provided by the combined incorporation of the dopant species 106A, 108A, 110A may be selected so as to provide the required moderate dopant concentration, but maintaining crystal damage at a moderately low level so as to enable a recrystallization on the basis of any appropriate anneal process 111 in a subsequent phase of the overall manufacturing process.

In some illustrative embodiments, a corresponding anneal process may be performed prior to a last implantation process, if any implantation-induced damage is considered too high so as to result, in combination with a last implantation process, in a substantial amorphization of exposed portions of the semiconductor layer 104. Consequently, crystal damage resulting from one or more preceding implantation processes may be healed, if considered appropriate, prior to performing a next implantation process, thereby achieving superior crystalline characteristics and possibly enabling the usage of a higher dose, if required. The one or more anneal processes 111 may be performed on the basis of any appropriate process technique, such as anneal techniques requiring very short anneal times in the range of nanoseconds to microseconds, when significant diffusion may be considered inappropriate. In this case, the respective junctions 106J, 108J, 110J may remain relatively sharp regions at which a respective more or less abrupt change in dopant concentration may be observed. In other cases, rapid thermal anneal processes may be applied with significantly longer process times, thereby initiating a certain degree of diffusion, which may result in more "rounded" and, thus, more continuous concentration variations, if desired.

It should also be appreciated that the anneal process 111 or one or more of the anneal processes, when two or more anneal processes may have to be used in establishing a desired laterally graded dopant profile, may be performed in any later manufacturing stage when the modification of the semiconductor layer 104 is compatible with the further processing for forming a gate electrode structure. For instance, an anneal process may be applied after having formed a respective gate electrode structure and possibly incorporating a further dopant species for obtaining a desired dopant concentration in respective drain and source regions.

Moreover, in the process sequence described with respect to FIGS. 1A-1C, a degree of masking represented by the distances 105L, 107L, 109L may increase, i.e., the distances may decrease, starting from the implantation mask 105, so that the implantation with lowest dose may be performed first, followed by an implantation with a somewhat increased dose and so forth. In other illustrative embodiments (not shown), the sequence of the implantation processes 106, 108, 110 may be selected in any desired manner, for instance, by providing the implantation mask 109 first and the implantation mask 105 last, so that the implantation process 110 may be performed as a first implantation process with a moderately high implantation dose.

Moreover, in the sequence described with reference to FIGS. 1A-1C, the respective implantation masks 105, 107, 109 may be provided as individual masks which may be formed on respective individual lithography and implantation processes. In other cases, the degree of masking and, thus, the lateral size of the implantation mask 105, which may be initially provided, may be increased by depositing an appropriate material, such as silicon dioxide and the like, prior to performing a next implantation step. Consequently, upon initially positioning the implantation mask 105 of FIG. 1A, any further masks may be obtained by deposition processes in a substantially self-aligned manner without requiring any additional lithography processes.

In other illustrative embodiments, as will be described in more detail later on with reference to FIGS. 2A-2E, the size of an initially provided implantation mask may be sequentially reduced in order to obtain different degrees of masking.

Figure 1D:
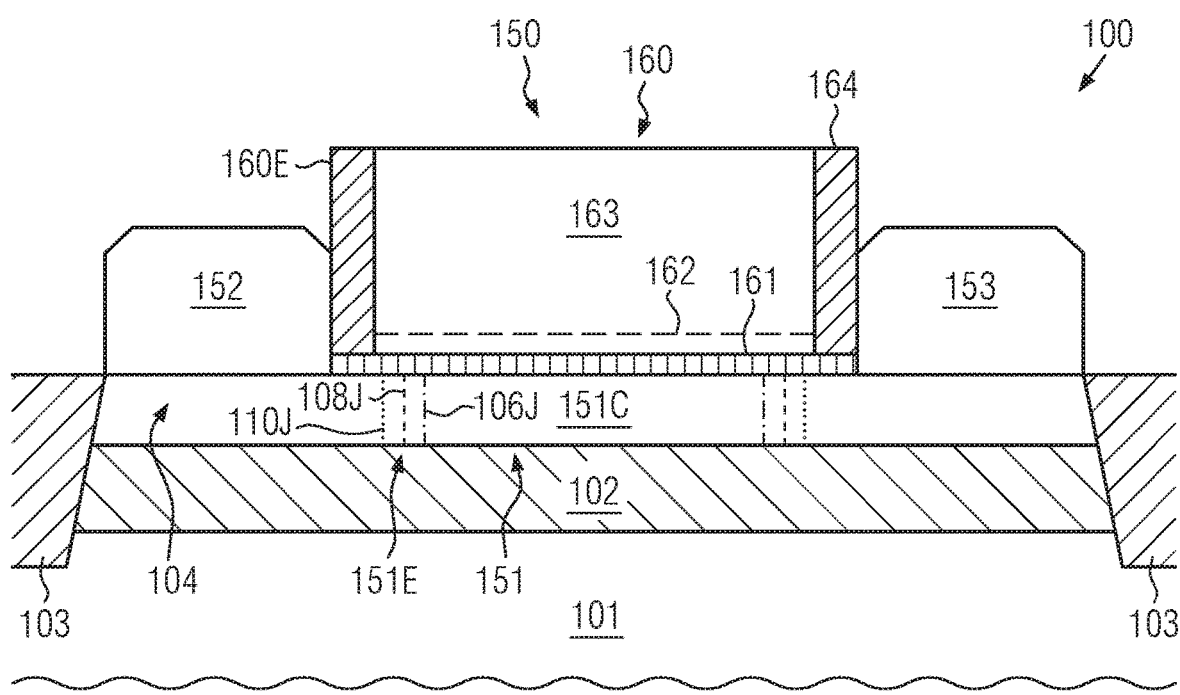
FIG. 1D schematically illustrates a transistor element of a semiconductor device in which at least one edge region of a channel region has a laterally graded dopant profile.

FIG. 1D schematically illustrates the semiconductor device 100 in a further advanced manufacturing stage. As illustrated, a transistor element 150 may be formed in accordance with selected design criteria, wherein, in particular, the semiconductor layer 104 may be used as a base semiconductor material having a thickness so as to provide a substantially fully depleted transistor configuration, as discussed above. Moreover, the transistor element 150 may comprise a gate electrode structure 160 including the respective gate edges 160E, which may, for instance, be defined by respective sidewall spacer elements 164, which may be formed of silicon nitride, silicon dioxide and the like, in order to encapsulate other sensitive materials of the gate electrode structure 160 and provide electric isolation with respect to drain and source regions 152, 153. The drain and source regions 152, 153 may be provided in a raised architecture in which highly doped crystalline semiconductor material may be formed on the semiconductor layer 104 in order to provide moderately high conductivity and to allow the formation of respective contact regions so as to connect to respective contact elements still to be formed in a contact level of the semiconductor device 100.

The gate electrode structure 160 may be formed above the channel region 151 including the central area 151C and, in the embodiment shown, the two edge regions 151E having the laterally graded dopant profile as indicated by the junctions 106J, 108J, 110J, as also discussed above. In other illustrative embodiments, the respective graded dopant profile may be formed on one edge region only, for instance, the edge region 151E positioned adjacent to the drain region 152. In order to appropriately electrically insulate an electrode material 163 of the gate electrode structure 160 from the channel region 151, a gate dielectric material 161 may be provided, for instance, in the form of silicon oxide, silicon oxynitride and the like, if a corresponding thickness and dielectric constant thereof are appropriate for achieving the desired channel controllability. In other cases, the gate dielectric material 161 may, instead of or in addition to a standard dielectric material, include a high-k dielectric material, which may then be provided in combination with an additional metal-containing threshold voltage-adjusting material and a respective barrier layer, which are commonly indicated by 162. It should be appreciated that, in some illustrative embodiments, the transistor element 150 and, in particular, the gate electrode structure 160, may be designed to be operated with a supply voltage of approximately 2.5 V and higher, such as 3.3 V, which are typical supply voltages for transistor elements used in I/O circuit portions. It should be appreciated, however, that the graded dopant profile in one or both edge regions 151E may also be advantageous for other transistor elements operated at reduced supply voltages, thereby even further enhancing overall reliability of such transistor elements.

The transistor element 150 as shown in FIG. 1D may be formed on the basis of the following processes. Starting from the device configuration as shown, for instance, in FIG. 1C, or from device configurations described later on with reference to FIGS. 2A-2E, 3A-3B and 4A-4B, the gate electrode structure may be formed on the semiconductor layer 104 above the channel region 151 so as to overlap at least a part of the edge regions 151E. To this end, well-established and sophisticated lithography and patterning strategies may be applied, for instance, by first forming the dielectric material 161 or at least a portion thereof, followed by the deposition of any further required material systems and the electrode material 163, possibly followed by the deposition of an appropriate dielectric cap material, such as silicon nitride and the like, which may be patterned and used as an etch mask for the subsequent patterning of the lower lying materials.

It should be appreciated that, in some illustrative embodiments, as discussed above with reference to FIGS. 1A-1C, the edge regions 151E, or at least one region thereof, may already include the graded dopant profile in a more or less graded or stepped manner, depending on any sequence of any processes previously performed, wherein also a substantially crystalline state of the semiconductor layer 104 may have been restored. Moreover, the gradation or the degree of lateral variation of the dopant profile in the edge regions 151E may be determined on the basis of the number of implantation processes performed during the subsequent process sequence and the respective process parameters used. For example, although three individual implantation processes may have been used for obtaining the three junctions 106J, 108J, 110J, in other illustrative embodiments, one or two implantation processes or four or more implantation processes may be used, depending on the required lateral dopant profile. Moreover, as also discussed above and as will also be explained in more detail later on, the respective junctions may be "blurred" so as to obtain a substantially continuously varying dopant profile, depending on the process parameters used in the one or more anneal processes.

Although, in principle, the respective anneal process for restoring the crystalline state of the semiconductor layer 104 may be performed after forming at least a portion of the gate electrode structure 160, in some illustrative embodiments, performing respective anneal processes prior to completing the gate electrode structure 160 may provide increased flexibility in applying specified process parameters of the anneal processes with respect to duration, temperature and the like.

After patterning the gate electrode structure 160, the drain and source regions 152, 153 may be formed, for instance, by selective epitaxial growth techniques, wherein appropriate dopant species may be introduced in the deposition atmosphere so as to obtain a highly in situ doped crystalline semiconductor material. Due to the previously incorporated dopant species in the semiconductor layer 104, in toto, a desired high dopant concentration may be obtained in the drain and source regions 152, 153 from top to bottom while, at the same time, a relatively smooth connection to the laterally graded dopant profile in the edge regions 151E may be achieved.

Thereafter, the further processing may be continued by, for instance, removing any cap material from the gate electrode structure 160 and forming contact portions (not shown), such as metal silicide in the form of nickel/platinum silicide and the like, in the drain and source region 152, 153 and the gate electrode structure 160, followed by the formation of contact elements (not shown) so as to connect to the various contact portions of the transistor element 150.

In the embodiment described above with reference to FIG. 1D, reference is made to a manufacturing strategy in which the gate electrode structure 160 may be provided as a functional structure in an early manufacturing stage, that is, prior to forming the raised drain and source regions 152, 153 and prior to forming any inter-level dielectric material, which may typically encapsulate the resulting transistor structure and which may also be used to form contact elements therein. In other strategies, the final functional configuration of the gate electrode structure 160 may be completed in a late manufacturing stage, for instance, by first providing at least some material systems, which may be replaced by the actual materials of the gate electrodes structure in a later manufacturing stage, i.e., after forming the drain and source regions 152, 153. Also in this case, the laterally gradient dopant profile in the edge regions 151E may be accomplished on the basis of the principles discussed above or as will be described in more detail later on.

In any case, by providing the laterally graded dopant profile represented by the junctions 106J, 108J, 110J, in at least the drain side etch region 151E, superior behavior may be achieved due to a significant reduction of the lateral electric field upon operating the transistor element 150.

Figure 1E:
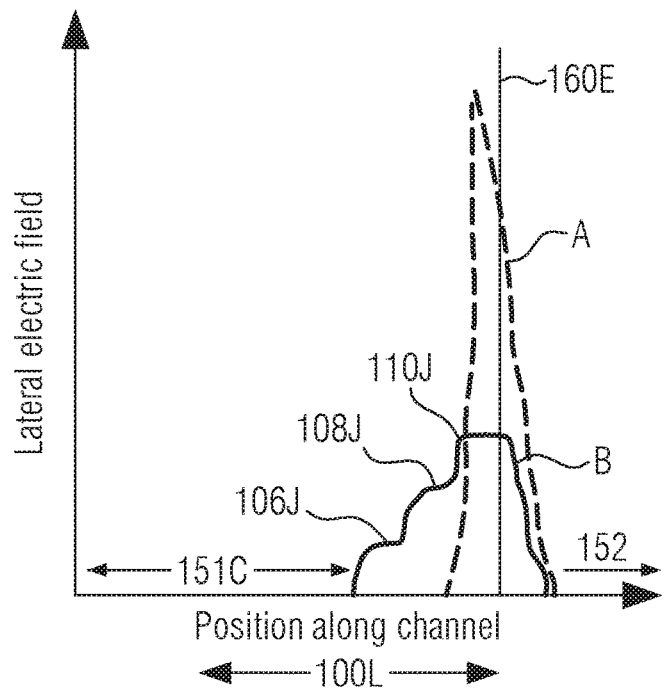
FIG. 1E schematically illustrates the qualitative operational behavior of a transistor element with respect to a lateral electric field.

FIG. 1E schematically illustrates the qualitative operational behavior of the transistor element 150 with respect to a lateral electric field, i.e., the field obtained during operation of the transistor element 150 along the length direction 100L. As illustrated, curve A represents a typical qualitative behavior of the lateral electric field for a transistor element having the same configuration as the transistor 150, however, without incorporating the laterally graded dopant profile. Consequently, in the vicinity of the gate edge 160E adjacent to the drain region 152, a significant peak may be observed, which may, thus, give rise to a significant degradation caused by hot carriers, which may be injected into the gate dielectric material in the vicinity of the respective edge 160E, as already discussed above. Consequently, at moderately high supply voltages, significant reliability issues may be observed, thereby rendering such conventional transistor elements less than desirable for being incorporated in sophisticated semiconductor devices.

On the other hand, the laterally graded dopant profile indicated by the junctions 106J, 108J, 110J may result in a significantly reduced maximum value of the lateral electric field, as indicated by curve B, thereby significantly reducing the probability of hot carrier injection and, thus, significantly enhancing reliability of the transistor element 150. On the other hand, in the central area 151C, the desired low value of the lateral electric field may still be preserved.

With reference to FIGS. 2A-2E, further illustrative embodiments will now be described in more detail so as to obtain the transistor element 150 as discussed above with reference to FIGS. 1D and 1E.

Figure 2A:
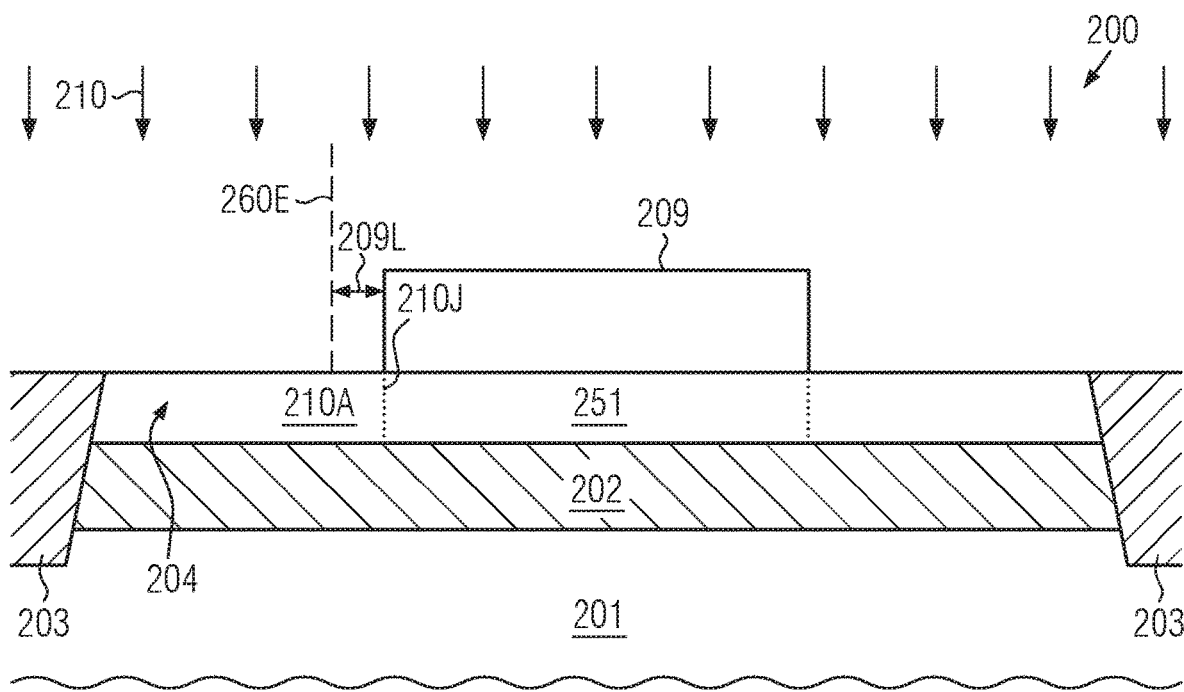
FIGS. 2A-2E schematically illustrate cross-sectional views of a semiconductor device during an early manufacturing phase in which masked implantation processes may be applied on the basis of a varying degree of masking in order to obtain a laterally graded dopant profile prior to forming a gate electrode structure.

FIG. 2A schematically illustrates a cross-sectional view of a semiconductor device 200 having a configuration similar to the semiconductor device 100 of FIG. 1A. That is, a semiconductor layer 204 may be bordered by isolation structures 203 and may also be vertically separated from a substrate material 201 by a buried insulating layer 202. With respect to these components, the same criteria may apply as previously discussed with reference to FIG. 1A.

Moreover, in this manufacturing stage, an implantation mask 209 may be provided so as to define a certain degree of masking of a channel region 251. The degree of masking may be defined by a lateral distance 209L of the implantation mask 209 from at least a drain side edge 260E of a gate electrode structure still to be formed. In this case, however, the implantation mask 209 may define a position of a maximum dopant concentration of a laterally graded dopant profile still to be formed. To this end, an implantation process 210 may be applied based on process parameters established on the basis of simulation calculations and/or experiments in order to introduce a dopant species 210A into exposed portions of the semiconductor layer 204. Consequently, after completing the implantation process 210, a respective junction 210J may be formed so as to be aligned with sidewall surfaces of the implantation mask 209.

Figure 2B:
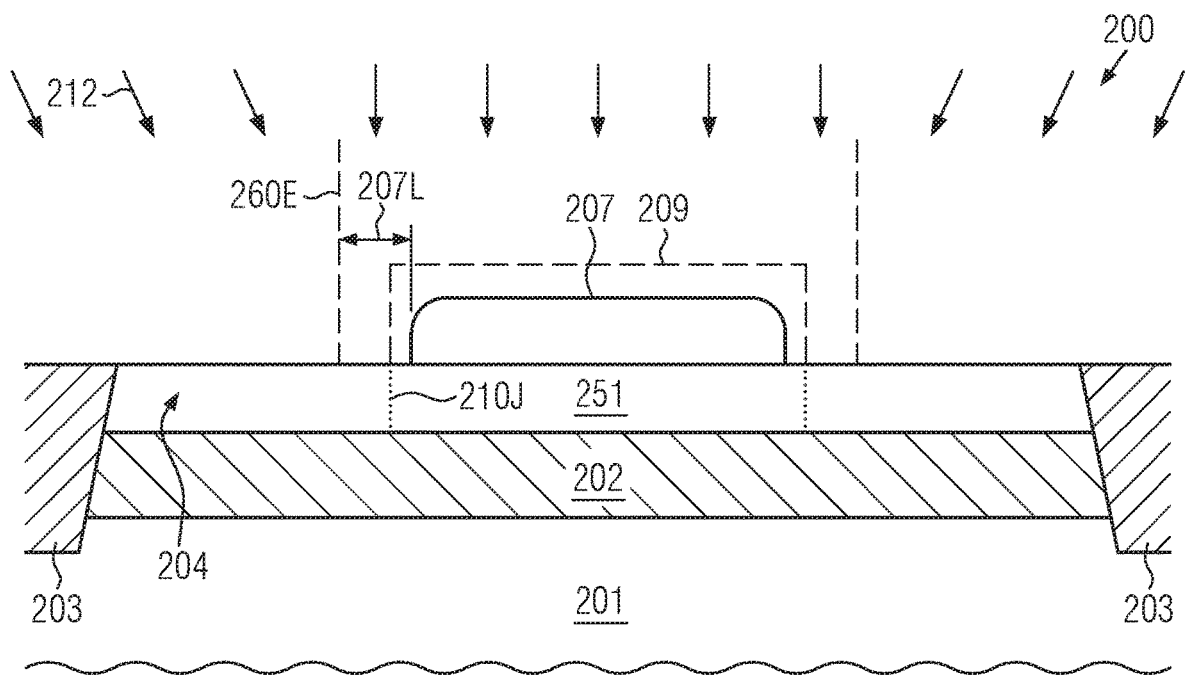

FIG. 2B schematically illustrates the semiconductor device 200 in a further advanced manufacturing stage in which a material removal process 212 may be applied so as to reduce the dimensions of the implantation mask 209 in order to obtain a reduced mask 207 and to define a further degree of masking indicated by the lateral distance 207L with respect to the edge 260E of the gate electrode structure still to be formed. To this end, a plurality of well-established resist trim processes is available and may be used, thereby obtaining the desired lateral distance 207L with a high degree of process controllability. It should be appreciated that the initial mask 209 may be designed, for instance, with respect to its vertical extension, so as to act as a reliable implantation mask even upon reducing its size during the process 212 and possibly during any further processes for further reducing the size of the initial mask 209.

Figure 2C:
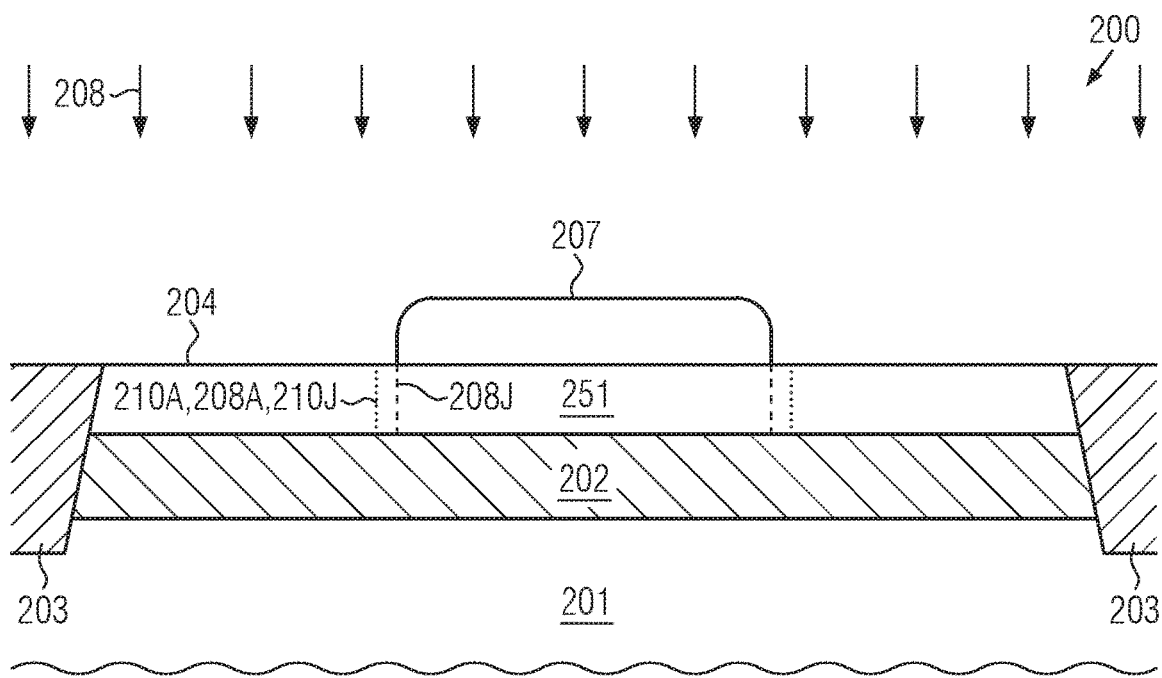

FIG. 2C schematically illustrates the semiconductor device 200 in a further advanced manufacturing stage in which a further implantation process 208 may be applied on the basis of appropriately selected process parameters, such as dose and energy, thereby introducing a further dopant species 208A into exposed portions of the semiconductor layer 204. Consequently, a further junction 208J may be formed on the basis of the implantation mask 207. It should also be appreciated that, with respect to any process parameters of the implantation process 208, the same criteria apply as discussed previously.

Figure 2D:
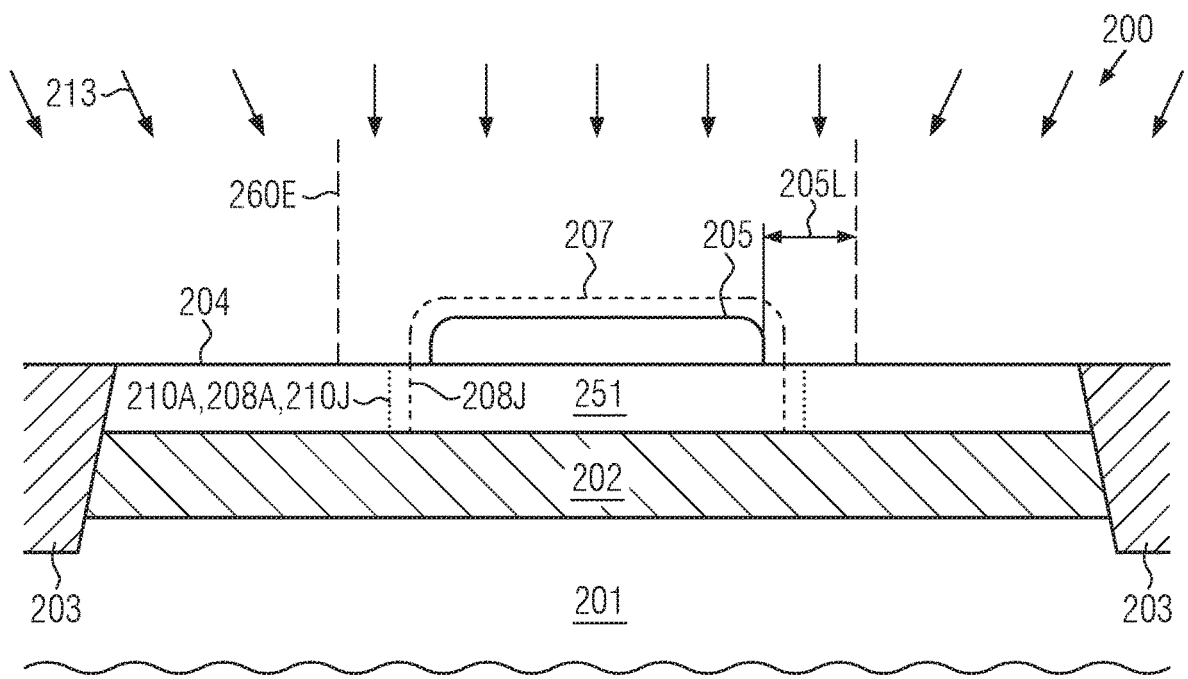

FIG. 2D schematically illustrates the semiconductor device 200 when exposed to a further reactive ambient 213 designed so as to reduce the size of the previously formed implantation mask 207, thereby obtaining a further implantation mask 205. The process 213 may be controlled so as to obtain the desired lateral distance 205L with respect to the gate edge 260E in order to appropriately define the degree of masking during a subsequent implantation process. It should be appreciated that, as discussed above, the height of the implantation mask 205 may still be sufficient so as to reliably prevent dopant species from penetrating into the central area of the channel region 251. To this end, the initial size of the implantation mask 209 (FIG. 2A) may be appropriately selected with respect to the implantation energy used in combination with the implantation mask 205.

Figure 2E:
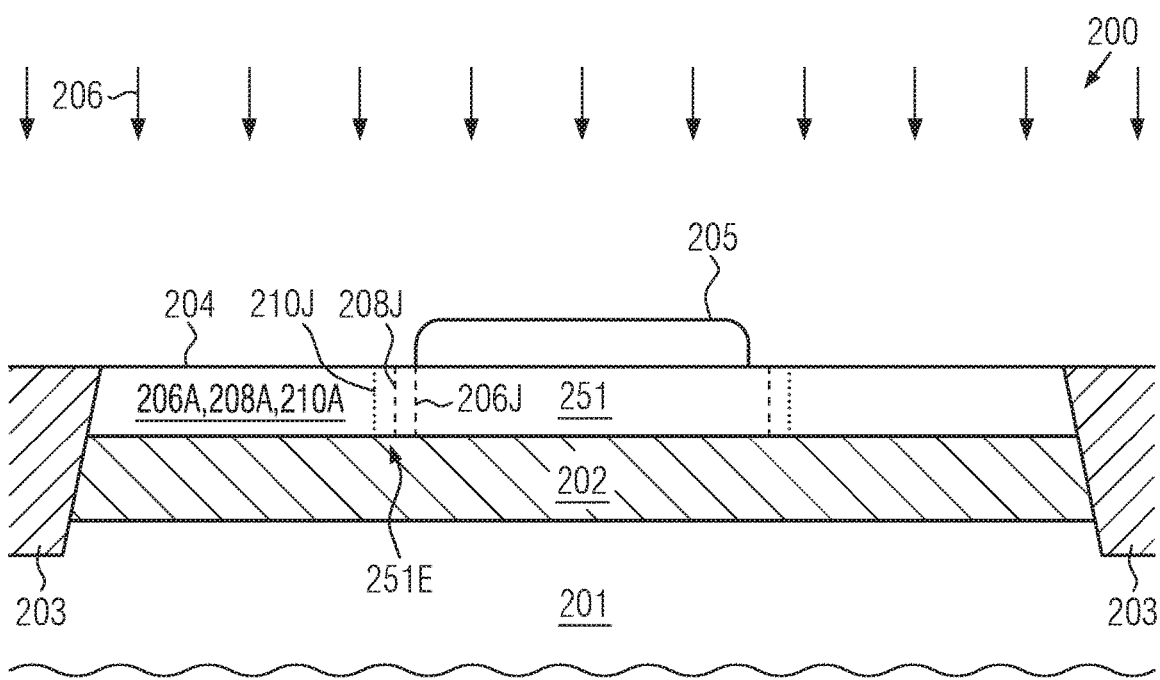

FIG. 2E schematically illustrates the semiconductor device 200 when subjected to a further implantation process 206 in which a further dopant species 206A may be incorporated so as to form a further junction 206J in an edge region 251E of the channel region 251. With respect to process parameters and type of dopant species to be used, reference may also be made to any of the embodiments described above.

As a consequence, the graded dopant profile indicated by the junctions 206J, 208J, 210J may be established on the basis of a process sequence in which at least some of the implantation masks may be obtained by applying a resist trim process or any other well-controllable removal process to a previously used implantation mask.

It should be appreciated that, in some illustrative embodiments, the process strategy described with reference to FIGS. 2a-2E may be combined with one or more of the strategies described previously with reference to FIGS. 1A-1C. That is, one or more of the implantation masks used may be formed by lithography, while one or more of the implantation masks may be obtained on the basis of a trim process applied to a previously used implantation mask. Moreover, although three implantation masks have been described above, two or four or more implantation masks may be used. Moreover, although the respective implantation processes described with reference to FIGS. 1A-1C and 2A-2E have been illustrated as substantially orthogonal implantation processes with respect to the lateral directions of the semiconductor device under consideration, one or more of the implantation processes may be applied as inclined implantation processes or wherein the implantation angle may be varied during a single implantation process.

Thereafter, the further processing may be continued so as to obtain the semiconductor device 100 as described in the context of FIG. 1D, while the functional behavior may be similar to the behavior described in the context of FIG. 1E.

Figure 3A:
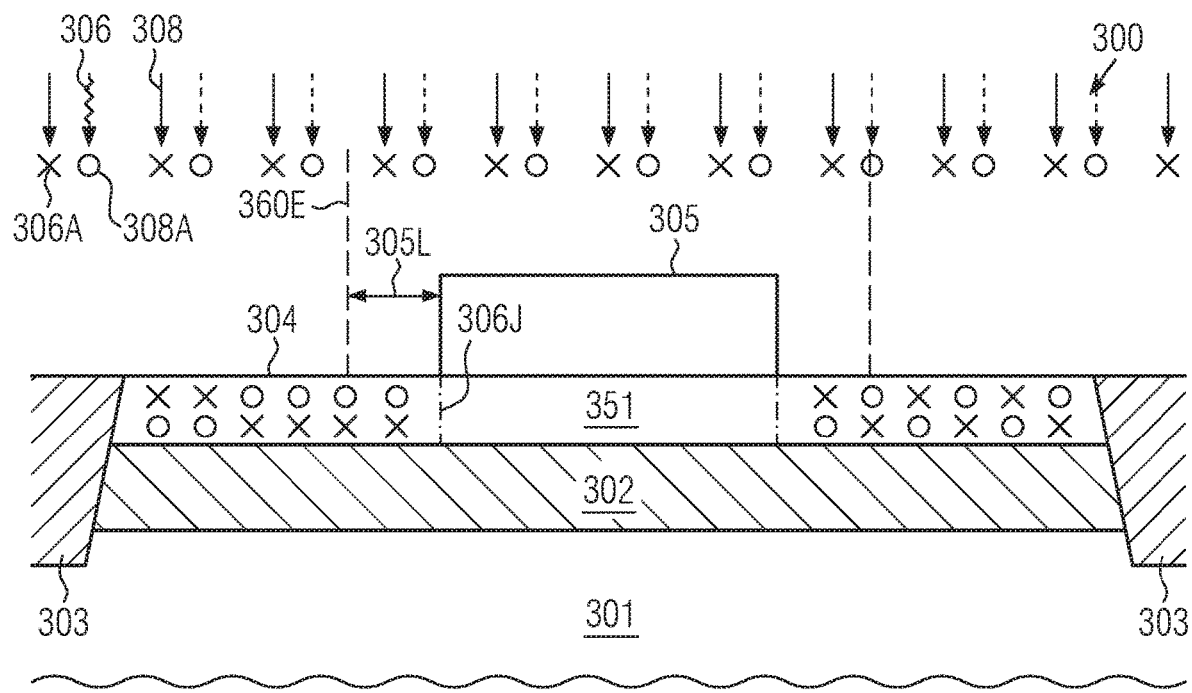
FIGS. 3A-3B schematically illustrate cross-sectional views of a semiconductor device during various manufacturing stages in which at least two different dopant species with different diffusion behavior may be incorporated into the basic semiconductor material so as to obtain a laterally graded dopant profile at edge regions of a channel region upon initiating a diffusion process.
Figure 3B:
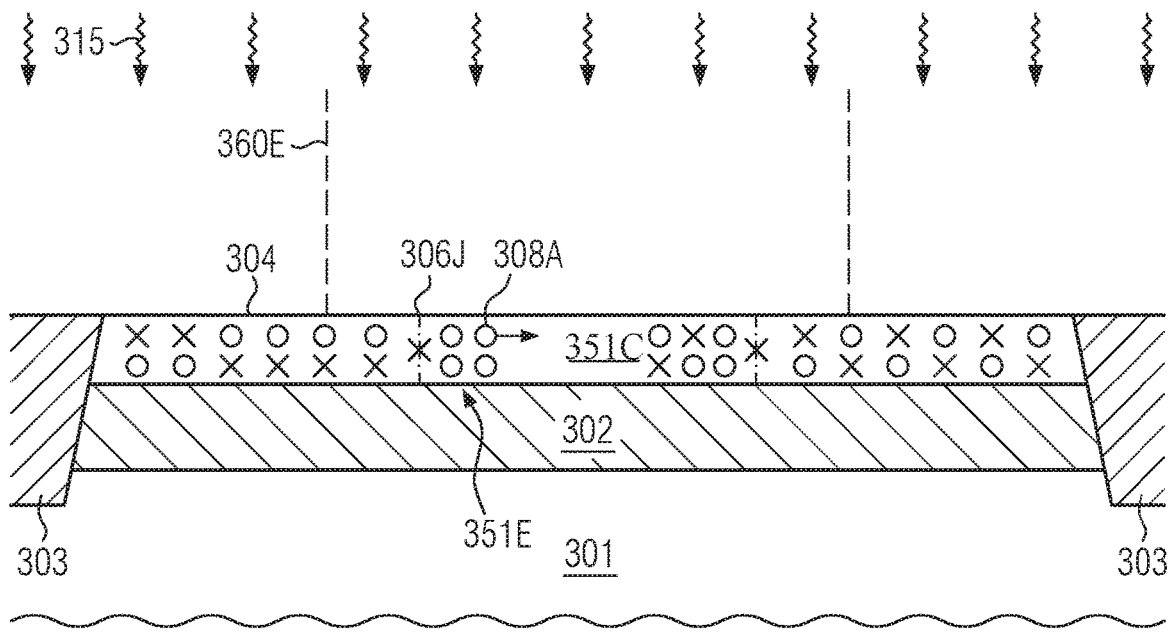

With reference to FIGS. 3A and 3B, further illustrative embodiments will now be described in more detail.

FIG. 3A schematically illustrates a cross-sectional view of a semiconductor device 300 comprising a substrate material 301, a buried insulating layer 302, isolation structures 303 and a semiconductor layer 304. With respect to these components, the same criteria may apply as discussed previously in the context of the semiconductor devices 100 and 200. Furthermore, in this manufacturing stage, an implantation mask 305 may be formed so as to provide a certain degree of masking as represented by a lateral distance 305L of the mask 305 with respect to an edge 360E of a gate electrode structure still to be formed. In an implantation sequence, indicated by individual implantation processes 306, 308, at least two different types of dopant species 306A, 308A may be incorporated into exposed portions of the semiconductor layer 304, thereby forming a respective junction 306J. The dopant species 306A, 308A may represent the same conductivity type, but may, however, be different with respect to diffusion characteristics. For instance, arsenic and phosphorus may represent N-type dopant species, wherein arsenic may have a significantly reduced diffusion coefficient compared to phosphorus. Moreover, with respect to selecting appropriate implantation energies and implantation doses, respective simulations may be performed and/or experiments may be carried out in order to obtain the desired penetration depth and concentration, while, nevertheless, maintaining the crystal damage at an acceptable level.

FIG. 3B schematically illustrates the semiconductor device 300 during one or more anneal processes 315 designed so as to restore the crystallinity of the semiconductor layer 304 and initiate a desired degree of diffusion of the dopant species 306A, 308A. In the present example, it may be assumed that diffusivity of the dopant species 308A may be greater compared to the diffusivity of the species 306A, thereby obtaining increased lateral penetration in order to define the lateral extension of the edge region 351E and a substantially continuously varying lateral dopant profile that decreases towards the center area 351C. It should be appreciated that appropriate process parameters, such as anneal temperature and process time for the one or more processes 315, may be selected on the basis of experiments and/or calculations, since a plurality of anneal techniques are typically well known in the art and may be used to adjust the laterally graded dopant profile in the edge region 351E in combination with the two or more dopant species 306A, 308A used in the previously applied process parameters of the respective implantation processes.

It should be noted that the concept of using two or more different implantation species with different diffusion behavior may, in some illustrative embodiments, be applied in two or more of the implantation processes described with reference to FIGS. 1A-1C and 2A-2E, thereby providing the possibility of obtaining a smoother variation of the lateral dopant profile, since, during a corresponding anneal process, a more continuous variation may be obtained. For example, the number of implantation masks to be used may be reduced by using one or more of the implantation masks in combination with two or more implantation processes in which respective different dopant species may be incorporated. As a consequence, for a given number of implantation masks to be used, a more continuous and smoother dopant profile may be achieved, while, in other cases, the number of implantation masks and, thus, possibly the number of lithography processes, may be reduced, while still achieving a desired degree of lateral variation of the dopant profile in the corresponding edge region.

In some illustrative embodiments, the implantation mask 305 may represent a portion of a gate electrode structure or a patterning mask used for patterning any underlying gate materials (not shown). In this manner, two or more dopants species of different diffusion behavior may be introduced in a self-aligned manner with respect to the gate edges 360E, while the gradation or lateral variation of the dopant profile in the edge regions 351E may be obtained by the different diffusion behavior. It is to be noted that, in some cases, one or more dopant species may have been incorporated on the basis of techniques as will be described with reference to FIGS. 4A and 4B and/or as are described above with reference to the devices 100 and 200.

It should be appreciated that the above-described masking regimes may be applied separately for different types of transistor elements, such as N-type transistors and P-type transistors, by appropriately masking respective device regions, in which the incorporation of one or more dopant species is not required. Consequently, the respective laterally graded dopant profile may be tailored with respect to a given type of transistor element.

Figure 4A:
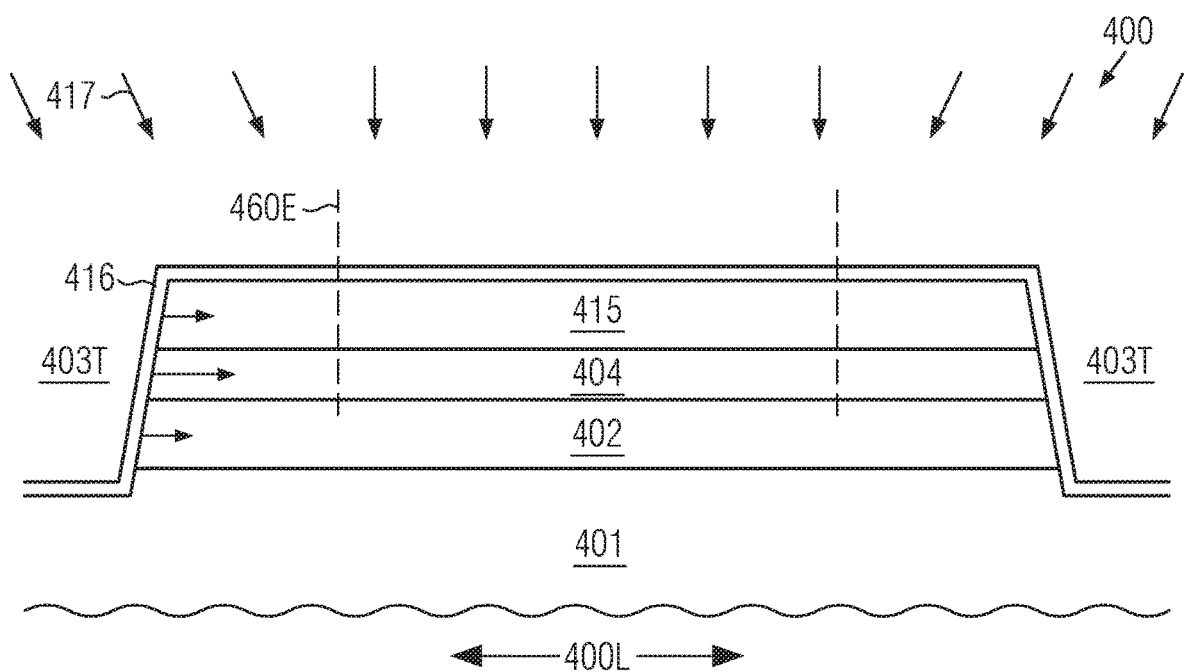
FIGS. 4A-4B schematically illustrate a cross-sectional view and a top view, respectively, of a semiconductor device in a manufacturing phase in which one or more dopant species may be laterally introduced from an isolation trench provided along one lateral direction of an active region of semiconductor devices.
Figure 4B:
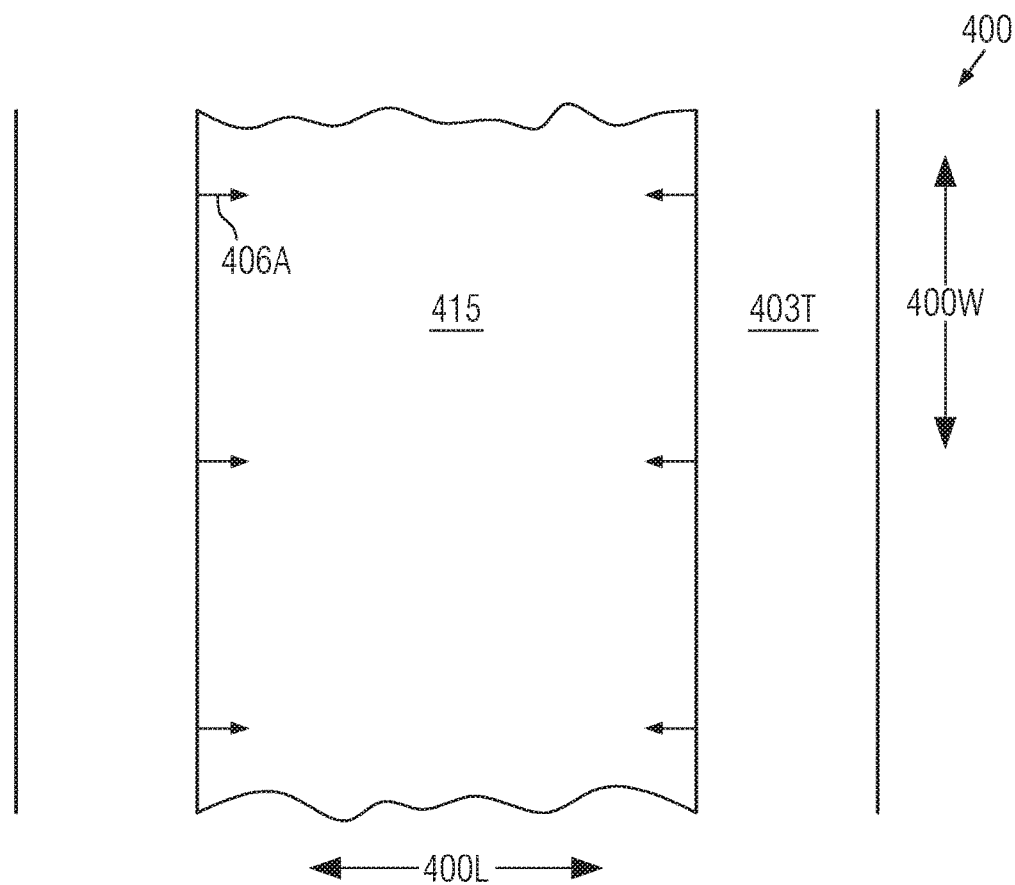

With reference to FIGS. 4A and 4B, further illustrative embodiments will now be described in more detail.

FIG. 4A schematically illustrates a cross-sectional view of a semiconductor device 400 comprising a substrate material 401, a buried insulating layer 402 and a semiconductor layer 404 formed thereon. With respect to these components, the same criteria may apply as discussed previously with reference to the semiconductor devices 100, 200 and 300. Furthermore, in the manufacturing stage shown, a protective layer 415, comprised of silicon nitride and/or silicon dioxide and the like, may be formed on the semiconductor layer 404, and isolation trenches 403T may be formed so as to define a lateral size along a transistor length direction 400L of the semiconductor layer 404.

Moreover, a diffusion layer 416 may be formed within the isolation trench 403T and on the protective layer 415. The diffusion layer 416 may be provided in the form of any appropriate material having incorporated therein one or more desired dopant species, which may laterally diffuse into the semiconductor layer 404 upon applying a respective anneal process 417. For example, the diffusion layer 416 may be formed of polysilicon, silicon dioxide and the like, wherein a respective dopant species may be incorporated during the respective deposition of the material layer 416 by introducing a respective dopant species with high concentration into the deposition atmosphere.

Basically, the isolation trenches 403T may be formed by applying well-established lithography and patterning techniques so as to etch through the layers 415, 404, 402 in accordance with well-established process recipes. Thereafter, the layer 416 may be deposited so as to include therein a respective high concentration of one or more dopant species. It should be appreciated that, as also explained in the context of FIGS. 3A and 3B, different dopant species of different diffusion behavior may be incorporated into the layer 416, such as arsenic and phosphorus for N-type transistor elements, while P-type dopant species may be incorporated into the layer 416 for P-type transistor elements. Therefore, in some illustrative embodiments, the diffusion layer for one type of dopant species may be deposited first and may be removed above device areas which may require the incorporation of a dopant species of opposite conductivity type. Thereafter, the respective diffusion layer may be deposited and the one or more anneal processes 417 may be applied, if a corresponding set of process parameters may be appropriate for the diffusion of both types of dopant species. In other cases, the dopant species of one conductivity type may be provided by a respective diffusion layer, such as the layer 416, which may be selectively formed above corresponding device regions, and the parameters of the anneal process 417 may be selected so as to obtain the desired lateral dopant profile upon applying a second anneal process or process sequence designed to obtain the desired lateral dopant profile for dopant species incorporated on the basis of a separately applied diffusion layer. Consequently, also in this case, the desired lateral dopant profile may be obtained in the semiconductor layer 404 for N-type transistor elements and P-type transistor elements, even if these dopant species may have very different diffusion behavior. Consequently, by selecting appropriate dopant species for the different conductivity types, and by selecting appropriate process parameters for the one or more anneal processes 417, the lateral diffusion may be controlled so as to obtain a desired lateral profile that may reach into the semiconductor layer 404 so as to achieve a respective varying dopant profile in the vicinity of a gate edge 460E of a gate electrode structure still to be formed.

FIG. 4B schematically illustrates a top view of the semiconductor device 400 according to illustrative embodiments where the isolation trenches 403T may extend along a transistor width direction 400W, thereby defining a length of respective active regions, while a separation along the length direction 400L of the layer 415 may not yet have taken place in order to define a width of the corresponding active region. Consequently, upon initiating the diffusion of dopant species, such as indicated by 406A, any unwanted dopant incorporation at respective end portions of the active regions along the transistor width direction 400W is substantially avoided.

As a result, the present disclosure provides techniques and semiconductor devices in which a laterally graded dopant profile in edge regions of channel regions of transistor elements may provide superior reliability, since the peak value of the lateral electric field may be significantly reduced, while still preserving the basic fully depleted transistor configuration formed on the basis of a very thin crystalline semiconductor layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming an isolation trench for laterally bordering an active region of a transistor element along one lateral direction, said active region including a channel region;
   forming a doped material in said isolation trench so as to provide an increased concentration of a dopant species laterally adjacent to said channel region;
   forming a laterally graded dopant profile in at least one of a first edge region and an oppositely positioned second edge region of said channel region, wherein forming said laterally graded dopant profile comprises initiating diffusion of said dopant species; and
   after forming said laterally graded dopant profile, forming a gate electrode structure on said channel region, said channel region at least partially overlapping said first and second edge regions.

2. The method of claim 1, wherein initiating said diffusion of said dopant species comprises performing an anneal process.

* * * * *